US006833654B2

United States Patent
Rubach

(10) Patent No.: US 6,833,654 B2
(45) Date of Patent: Dec. 21, 2004

(54) DUAL CRYSTAL PACKAGE

(75) Inventor: Robert W. Rubach, Burlington, WI (US)

(73) Assignee: CTS Corporation, Elkhart, IN (US)

( * ) Notice: Subject to any disclaimer, the term of this patent is extended or adjusted under 35 U.S.C. 154(b) by 114 days.

(21) Appl. No.: 10/254,723

(22) Filed: Sep. 25, 2002

(65) Prior Publication Data
US 2004/0056566 A1 Mar. 25, 2004

(51) Int. Cl.$^7$ .............................................. H01L 41/08
(52) U.S. Cl. ...................................... 310/344; 318/348
(58) Field of Search ................................ 310/340, 344, 310/3, 48, 342, 370, 346, 348

(56) References Cited

U.S. PATENT DOCUMENTS

| 2,101,272 A | | 12/1937 | Scott | |
|---|---|---|---|---|
| 2,771,561 A | * | 11/1956 | Fuller | 310/342 |
| 4,112,324 A | * | 9/1978 | Yamaguchi et al. | 310/353 |
| 4,131,861 A | | 12/1978 | Malaviya | |
| 4,219,754 A | * | 8/1980 | Hoshi et al. | 310/315 |
| 4,287,447 A | * | 9/1981 | Skoda et al. | 310/348 |
| 4,361,778 A | * | 11/1982 | Luff et al. | 310/348 |
| 4,370,625 A | | 1/1983 | Someshwar | |
| 4,375,041 A | * | 2/1983 | Aizawa et al. | 310/348 |
| 5,093,633 A | | 3/1992 | Benhamida | |
| 5,109,176 A | * | 4/1992 | Nguyen et al. | 310/348 |
| 5,302,879 A | | 4/1994 | Totty | |
| 5,438,219 A | | 8/1995 | Kotzan | |
| 6,049,256 A | | 4/2000 | Fry | |
| 6,229,249 B1 | * | 5/2001 | Hatanaka et al. | 310/348 |
| 6,229,404 B1 | | 5/2001 | Hatanaka | |
| 6,242,987 B1 | | 6/2001 | Schopf | |
| 6,304,151 B1 | | 10/2001 | Uehara | |
| 6,445,254 B1 | * | 9/2002 | Shibuya et al. | 331/68 |
| 6,456,168 B1 | * | 9/2002 | Luff | 331/68 |
| 6,734,605 B2 | * | 5/2004 | Kinoshita | 310/348 |

FOREIGN PATENT DOCUMENTS

JP      11-308052     *  5/1999

* cited by examiner

Primary Examiner—Mark Budd
(74) Attorney, Agent, or Firm—Mark P. Bourgeois

(57) ABSTRACT

A crystal package that contains two or more crystals that resonate at differing frequencies. The crystal package has a substrate with a top surface, a bottom surface, and side surfaces. A cavity is located in the top surface. A pair of steps are located in the cavity. A crystal is mounted to one of the steps and extends over the cavity. Another crystal is mounted to the other step and extends over the first crystal. The steps are at different heights above the bottom surface. Electronic circuitry may also be mounted within the crystal package.

22 Claims, 6 Drawing Sheets

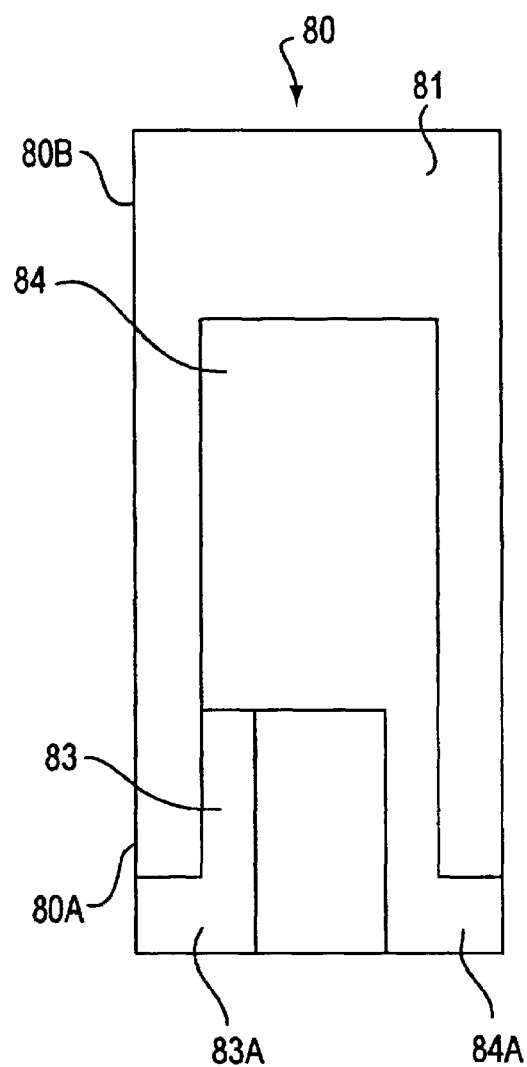
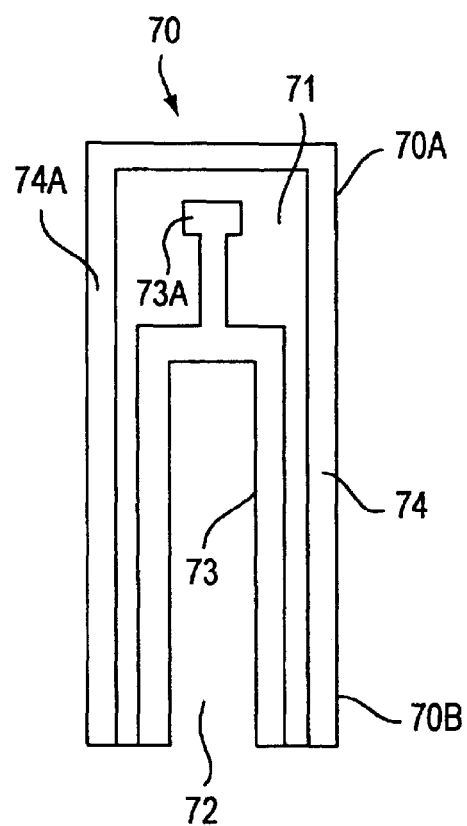
FIG. 3
FIG. 4

DUAL CRYSTAL PACKAGE

TECHNICAL FIELD

This invention relates to crystals for radio-frequency devices, and in particular, to a dual crystal package for crystal oscillators that has two crystals that resonate at different frequencies.

BACKGROUND

Oscillators use a piezoelectric material such as a quartz crystal and electronic circuitry to provide a reliable and stable oscillator output signal. The crystal is mounted in a package. Oscillators and crystals are commonly found in portable radio frequency (RF) communication equipment, such as cellular telephones, pagers and wireless modems. In portable communications equipment, it is necessary to minimize the size of the crystal package as well as to minimize the power consumed by the device because of the use of battery power. One such application is in local communication device modules such as bluetooth that are designed into cell phones and laptop computers.

The amount of power consumed by a crystal resonator is proportional to the frequency of the oscillator. One way to reduce the power consumption in electronic equipment is to place the equipment in a sleep mode during periods of non-use. A further power reduction technique is to shift from using a high frequency oscillator during normal operation to a low frequency oscillator during the sleep mode. This has been previously done using two separate crystals and circuits mounted on a circuit board. Unfortunately, this technique uses more circuit board space. For example, a crystal resonator operating at 32 Megahertz will draw 75 milliwatts, while a crystal resonator operating at 32 Kilohertz will draw 0.075 milli-watts. The 32 MHz crystal consumes 1000 times more power than the 32 KHz crystal.

The height, width and depth of the package are dependent upon the size of the crystal, any circuitry and the package dimensions. In portable electronic devices, it is necessary to minimize the size of the device. The demand for smaller cellular telephones and other electronic products requires even smaller physical dimensions.

U.S. Pat. Nos. 6,229,249, 6,229,404 and 5,438,219 show a prior art crystal oscillator that has a crystal and electronic circuitry attached to a substrate. These crystal packages only contain a single crystal.

Therefore, a current unmet need exists for a crystal package that has a small size, that can hold two or more crystals, that can be easily mass produced at low cost and that maintains a stable frequency of operation over the life of the oscillator.

SUMMARY

This invention overcomes problems of the prior art by providing a crystal package that contains two or more crystals that operate at differing frequencies. An embodiment of this invention is a crystal package that has a substrate having a top surface, a bottom surface, and side surfaces. A cavity is located in the top surface. A first step is located in the cavity. A second step is located in the cavity. A first crystal is mounted to the first step and extends over the cavity. A second crystal is mounted to the second step and extends over the first crystal.

There are other advantages and features of this invention which will be more readily apparent from the following detailed description of the preferred embodiment of the invention, the drawings, and the appended claims.

BRIEF DESCRIPTION OF THE FIGURES

FIG. 3 is a top view of a crystal;

FIG. 4 is a top view of another crystal;

DETAILED DESCRIPTION OF PREFERRED EMBODIMENTS

Figure 1:
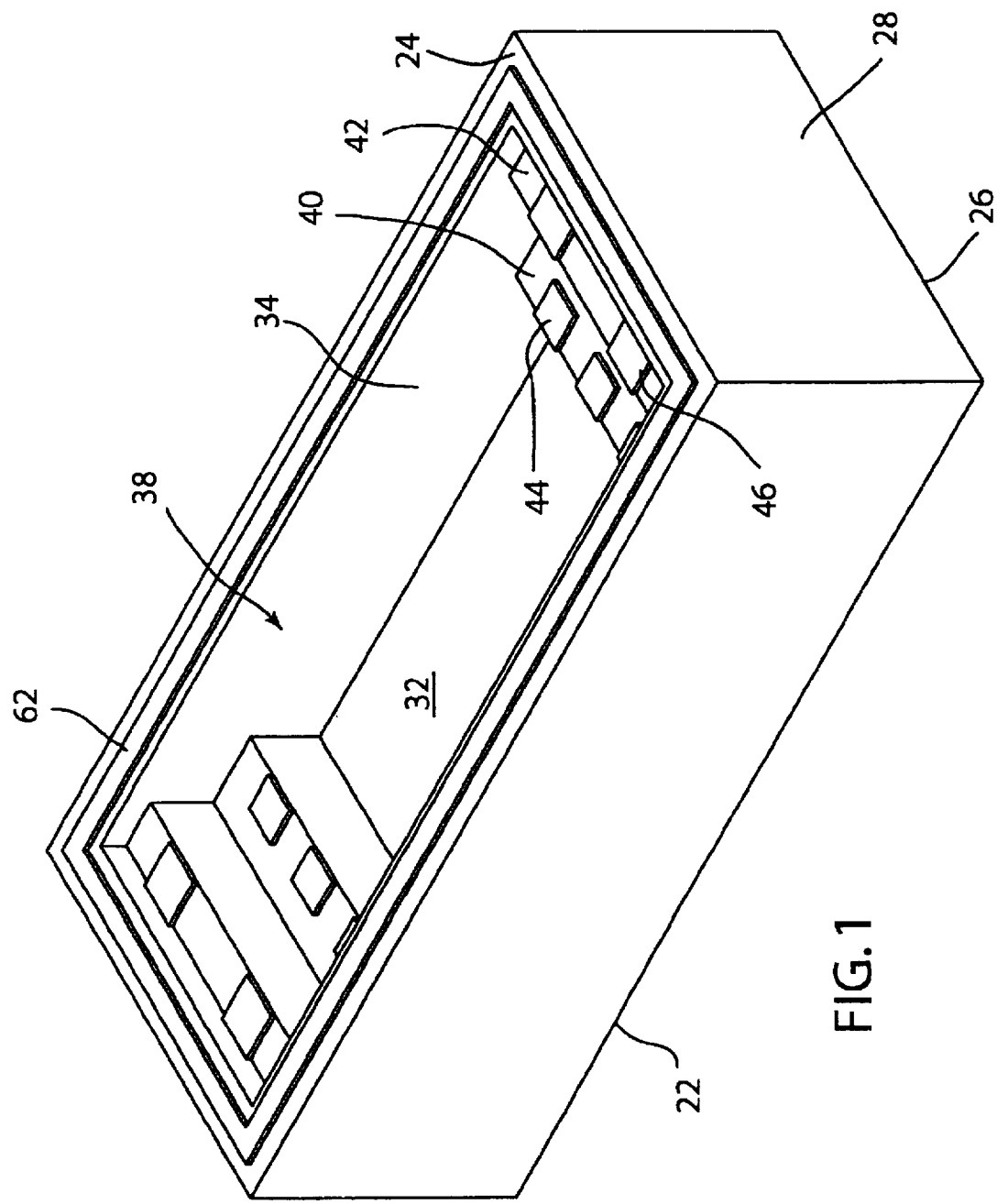
FIG. 1 is a perspective view of an oscillator package substrate prior to assembly according to the present invention.
Figure 2:
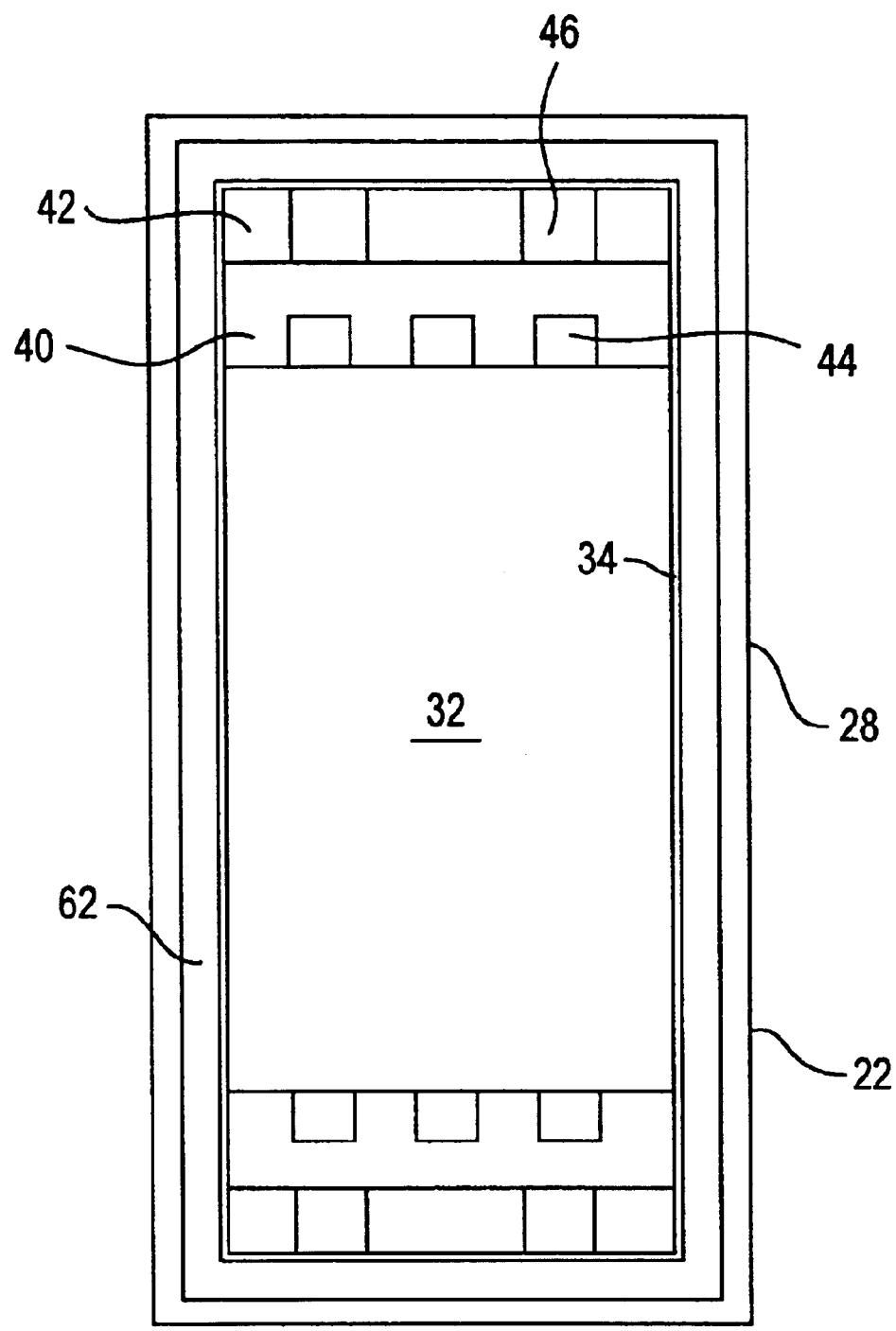
FIG. 2 is a top view of FIG. 1.

While this invention is susceptible to embodiment in many different forms, this specification and the accompanying drawings disclose only preferred forms as examples of the invention. The invention is not intended to be limited to the embodiments so described, however. The scope of the invention is identified in the appended claims.

Referring to FIGS. 1–5, a crystal package 20 includes a ceramic substrate 22. Substrate 22 is preferably a high temperature alumina ceramic. Substrate 22 has a top surface 24, a bottom surface 26, four side surfaces 28 and a top cavity or crystal receptacle 38. Cavity 38 has a cavity bottom surface 32 and cavity side walls 34. A pair of steps 40 and 42 are located in cavity 38 on a pair of opposing side walls 34. Steps 40 and 42 have different heights above bottom surface 26.

Several contact pads 44 are located on step 40. Several contact pads 46 are located on step 42. The contact pads are preferably gold plated. Vias 48 are located in substrate 22. Vias 48 are electrically connected to contact pads 44 and 46. Vias 48 extend through substrate 22 from top surface 24 to bottom surface 26.

A seal ring pad 62 is located on top surface 24. Seal ring pad 62 is formed from gold and nickel plated tungsten. A metal seal ring 64 is attached to seal ring pad 62. Seal ring 64 is formed from Kovar and is brazed to seal ring pad 62. A cover 66 is attached to seal ring 64. Cover 66 hermetically seals cavity 38.

Two quartz crystals 70 and 80 are located in cavity 38. Crystal 70 is a low frequency tuning fork crystal. Crystal 70 would typically resonate at 30 Kilohertz. Crystal 70 has an end 70A and a pair of ends 70B. A gap 72 is located between ends 70B. Crystal 70 has a top surface 71 and a bottom surface 72 (not shown). The crystal has a pair of gold plated electrodes 73 and 74. Electrodes 73 and 74 have contact areas 73A and 74A. Electrode 73 and 74 is located on surface 71.

Crystal 80 can be a rectangular AT cut crystal. Crystal 80 would typically resonate at 30 Megahertz. Crystal 80 has ends 80A and 80B. Crystal 80 has a top surface 81 and a bottom surface 82 (not shown). The crystal has a pair of gold plated electrodes 83 and 84. Electrodes 83 and 84 have contact areas 83A and 84A. Electrode 84 is located on surface 81. Electrode 83 is on surface 82 and the contact area 83A wraps around the side of the crystal and is located on surface 81.

A metal bump 90 is attached between the electrode pads 73A, 74A, 83A, 84A and contact pads 44 and 46. The metal bump provides an electrical connection between the crystal and the substrate. The metal bump further mechanically supports the crystal without imparting excessive stress to the crystal. Metal bumps 90 can be ultrasonically deposited gold or an alloy of gold and palladium. Metal bumps 90 can also be a cured conductive adhesive.

Crystal 70 is connected to contact pads 44 on step 40 at end 70A by metal bumps 90 being connected between pads 44 and electrode pads 73A and 74A. Similarly, crystal 80 is connected to contact pads 46 on step 42 at end 80A by metal bumps 90 being connected between pads 46 and electrode pads 83A and 84A. It is noted that crystal 70 it attached to step 40 at one end and extends or is cantilevered over cavity 38 toward the opposing step 40. Crystal 80 it attached to step 42 at one end and extends or is cantilevered over cavity 38 above crystal 70 toward the opposing step 42. Affixing the crystal at one end allows the crystal to resonate with less mechanically induced stress.

Termination pads 50 are located on bottom surface 26 and are electrically connected to vias 48. The termination pads would be soldered to an external circuit board (not shown) in order to connect with another electrical circuit such as in a cell phone, PDA or computer. A metal cover 66 is attached to the seal ring 64 to hermetically seal cavity 38. The cover is formed from Kovar and is seam welded to ring 64.

Since, the area taken up by the oscillator package is slightly larger than the area taken up by the crystals and the crystals are stacked on top of each other, a crystal package is obtained that takes up a small amount of circuit board space and has a high density.

Alternative Embodiments

Figure 6:
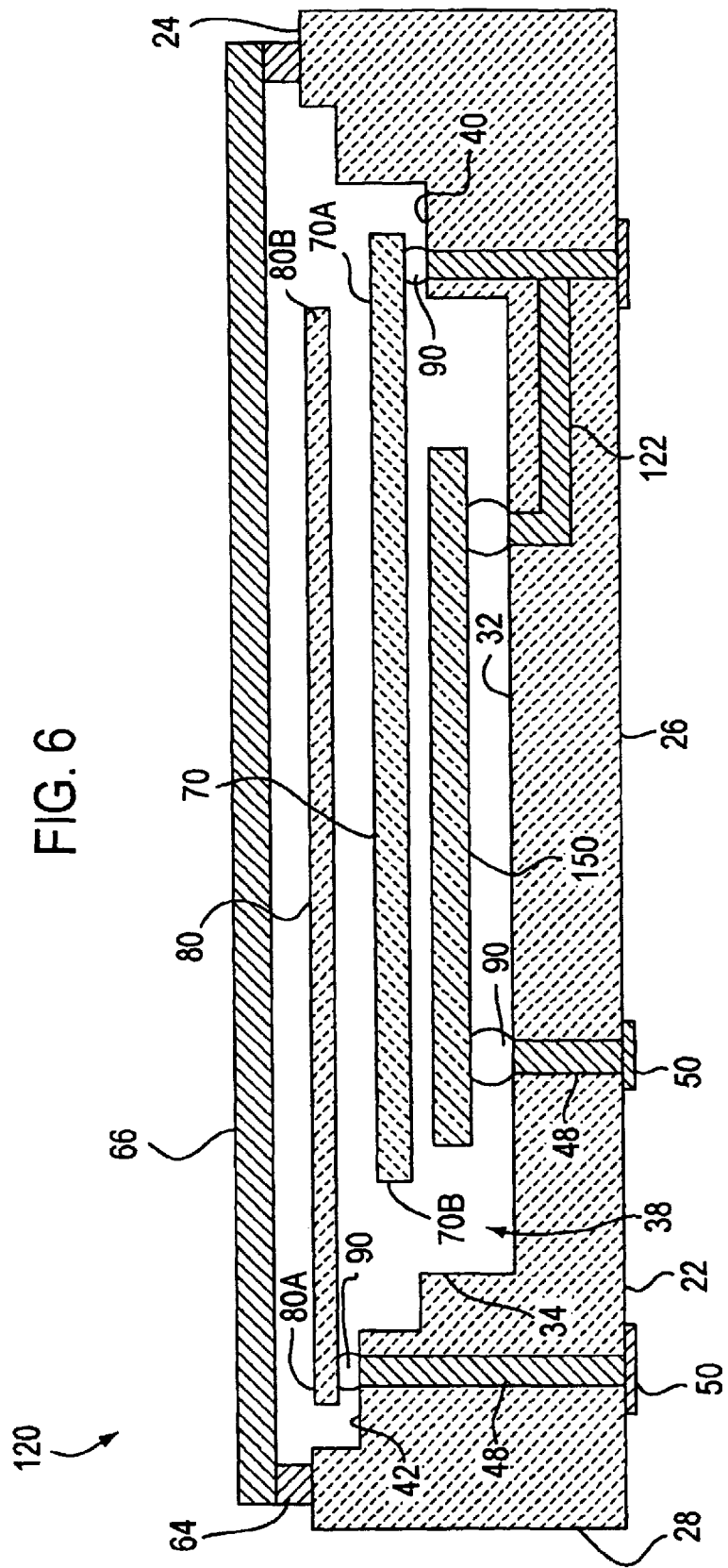
FIG. 6 is an alternative embodiment of an oscillator package.

Referring to FIG. 6, an alternative embodiment of a crystal package 120 is shown. Crystal package 120 is similar to crystal package 20 except that an integrated circuit 150 has been added and the step structure has been modified.

An integrated circuit or semiconductor die 150 is located in the cavity 38 above surface 32 and is electrically connected to vias 48 through metal bump 90. Semiconductor die 150 is a conventional oscillator integrated circuit and can include temperature compensation circuitry. Integrated circuit 150 in conjunction with crystals 70 and 80 function as a dual frequency oscillator that has a sleep mode with very low power consumption. Typically crystal 70 would only consume 0.001 milliwatts per hour while crystal 80 would consume 1 milliwatt per hour.

Figure 5:
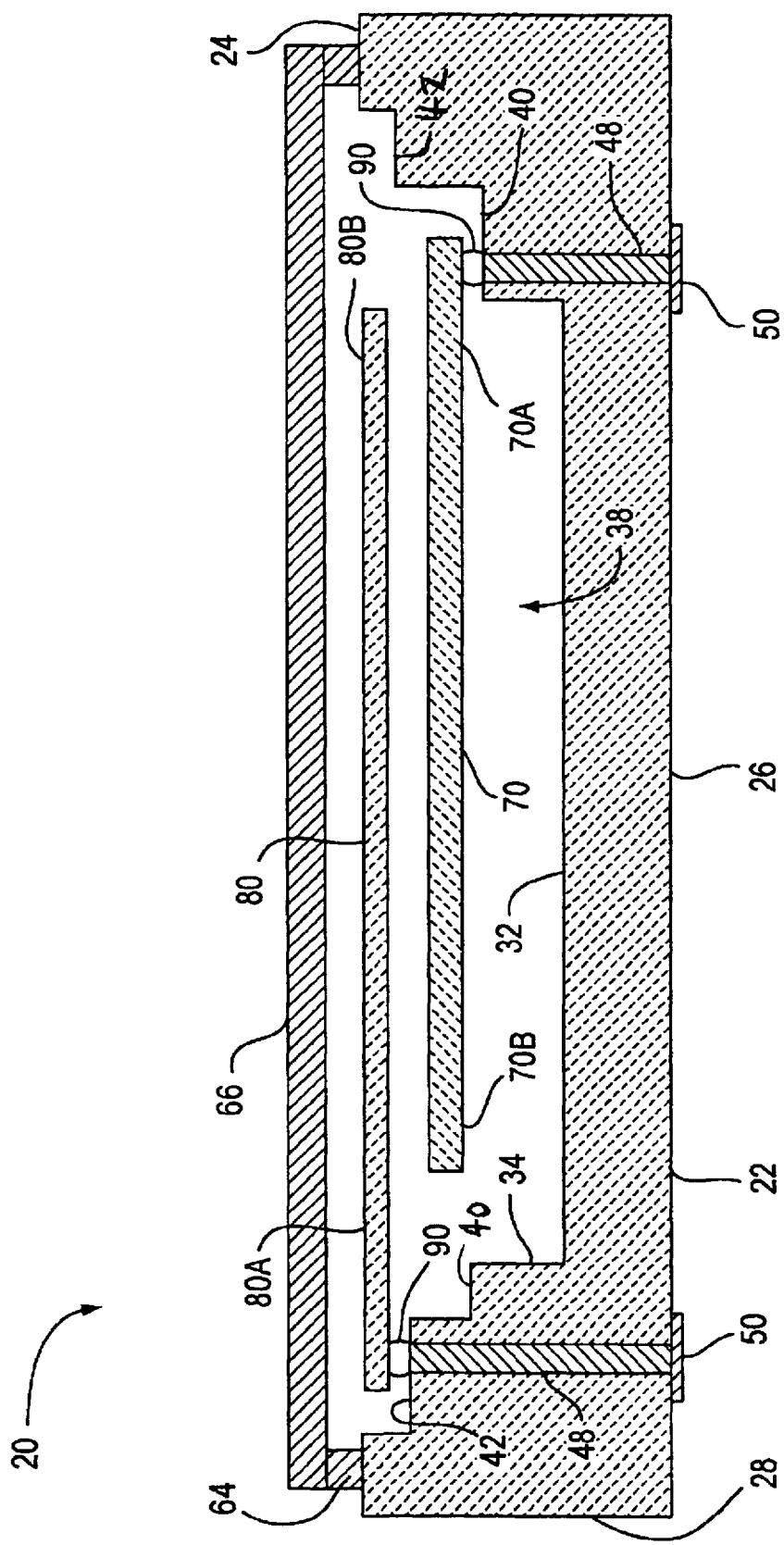
FIG. 5 is a side cross-sectional view of an assembled oscillator package according to the present invention.

In FIG. 6, the two step structure of FIG. 5 has been modified so that only one of steps 40 and 42 are located on opposite sides of cavity 38. Circuit lines 122 internal to substrate 22 connect vias 48 to integrated circuit 150.

Figure 7:
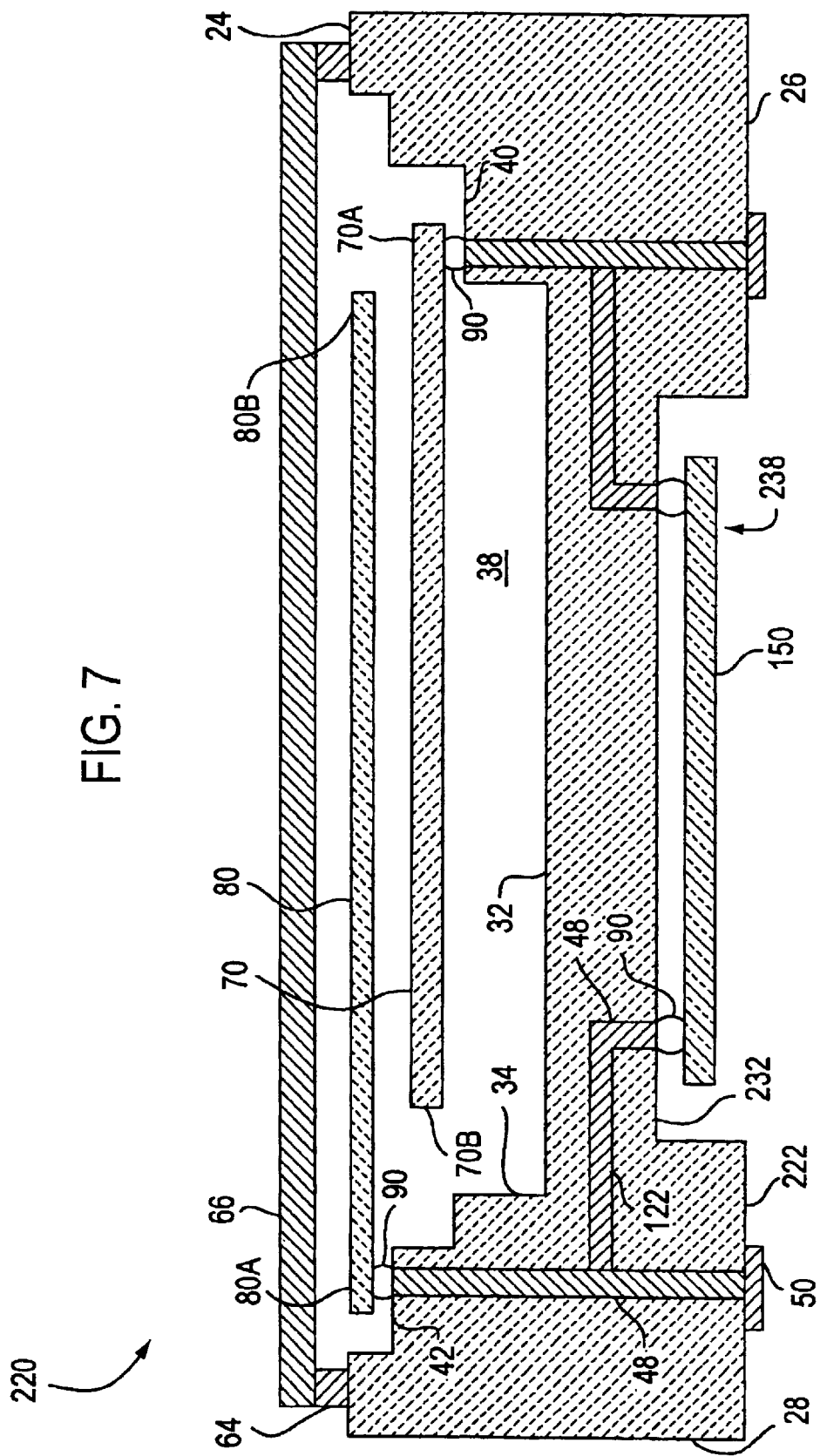
FIG. 7 is another embodiment of an oscillator package.

Referring to FIG. 7, another embodiment of a crystal package 220 is shown. Crystal package 220 is similar to crystal package 20 except that a second cavity 238 to hold integrated circuit 150 has been added.

Cavity 238 is located in bottom surface 26. An integrated circuit or semiconductor die 150 is located in the cavity 238 above surface 232 and is electrically connected to vias 48 through metal bump 90. Circuit lines 122 connect vias 48 to integrated circuit 150. The integrated circuit 150 can be sealed in cavity 238 by a cover (not shown) or by an organic sealant such as silicone (not shown). Semiconductor die 150 is a conventional oscillator integrated circuit and can include temperature compensation circuitry. Integrated circuit 150 in conjunction with crystals 70 and 80 function as a dual frequency oscillator that has a sleep mode with very low power consumption.

Assembly Process

The process sequence for the assembly of oscillator package 20 is as follows: A conductive adhesive is placed on contact pad 44 to form bump 90. Crystal 70 is picked up by a tool using a vacuum and electrode contacts 73A and 74A are placed over bump 90. The conductive adhesive is then cured. Alternatively, crystal 70 can be attached using an ultrasonic gold bond.

Next, the resonant frequency of crystal 70 is adjusted or tuned. Substrate 22 is placed in a vacuum chamber and contact probes (not shown) are brought into contact with termination pads 58. A mask is placed over the top of the crystal such that only the gold plated electrode areas are showing through the mask. An oscillating signal is applied to crystal 70 causing the crystal to vibrate at a resonant frequency. The resonant frequency of crystal 70 is then adjusted to the desired frequency by removing some of the gold covering the electrode using an ion beam or laser. When the desired frequency is reached, the substrate is removed from the vacuum chamber.

Next, conductive adhesive is placed on contact pads 46 to form bumps 90. Crystal 80 is picked up by a tool using a vacuum and electrode contacts 83A and 84A are placed over bump 90. The conductive adhesive is then cured. Alternatively, crystal 80 can be attached using an ultrasonic gold bond.

Next, the resonant frequency of crystal 80 is adjusted or tuned. Substrate 22 is placed in a vacuum chamber and contact probes (not shown) are brought into contact with termination pads 58. A mask is placed over the top of the crystal such that only the gold plated electrode areas are showing through the mask. An oscillating signal is applied to crystal 80 causing the crystal to vibrate at a resonant frequency. The resonant frequency of crystal 80 is then adjusted to the desired frequency by removing some of the gold covering the electrode using an ion beam or laser.

Next, substrate 22 is placed into a chamber containing dry nitrogen where cover 66 is placed over seal ring 64 and seam welded using conventional welding equipment. The package is then leak checked by filling the chamber with helium and then drawing a vacuum on the chamber while a sensor detects any helium that may be leaking from inside the sealed crystal. The crystal package 20 is then electrically tested.

Remarks

The crystal package was show having two crystals. More than two crystals could be mounted in the crystal package by adding additional steps 40 or 42. For example, 3, 4 or 5 different crystals all operating a different frequencies could be mounted in a single package.

One skilled in the art of crystal and oscillator design will realize that the present invention has many advantages. By using more than one crystal with one of the crystals resonating at a low frequency and the other operating at a higher frequency, a savings of power and extension of battery life can be obtained. The low frequency crystal allows a very low rate of power consumption to occur during a sleep mode. The high frequency crystal supports the clock rate necessary for the electronic device to function properly.

Crystal 80 operating at 30 Mhz will have a typical frequency stability of ±/−20 ppm from −20 to +70 Celsius. This provides a highly accurate timing reference during normal operation of a portable electronic device. Crystal 70 operating at 30 Khz will have a typical frequency stability of ±/−100 ppm from −20 to +70 Celsius. This provides a reasonably accurate timing reference during a sleep mode operation of a portable electronic device.

Numerous variations and modifications of the embodiments described above may be effected without departing from the spirit and scope of the novel features of the invention. It is to be understood that no limitations with respect to the specific system illustrated herein are intended or should be inferred. It is, of course, intended to cover by the appended claims all such modifications as fall within the scope of the claims.

What is claimed is:

1. A crystal package comprising:
   a) an insulative substrate having a top surface, a bottom surface, and side surfaces;
   b) a cavity located in the top surface;
   c) a first step located in the cavity;
   d) a second step located in the cavity;
   e) a first crystal mounted to the first step and extending over the cavity, the first crystal operating at a first frequency; and
   f) a second crystal mounted to the second step and extending over the first crystal, the second crystal operating at a second frequency.

2. The crystal package according to claim 1, wherein the first crystal consumes less power during operation than the second crystal.

3. The crystal package according to claim 1, wherein at least one contact pad is located on each step, each crystal having an electrode electrically connected to the contact pad.

4. The crystal package according to claim 3, wherein a metal bump connects the electrode to the contact pad.

5. The crystal package according to claim 3, wherein a conductive adhesive connects the electrode to the contact pad.

6. The crystal package according to claim 3, wherein a conductive adhesive connects the electrode to the contact pad.

7. The crystal package according to claim 3, wherein a conductive via extends through the substrate between the contact pad and the bottom surface.

8. The crystal package according to claim 6, wherein a termination pad is located on the bottom surface and is electrically connected to the via.

9. The crystal package according to claim 8, wherein a cover seals the cavity.

10. The crystal package according to claim 1, wherein an electronic circuit is mounted in the cavity and electrically connected to the first and second crystals.

11. The crystal package according to claim 1, wherein the substrate has a second cavity in the bottom surface, an electronic circuit mounted in the second cavity and electrically connected to the first and second crystals.

12. A crystal package comprising:
    a) a substrate having a cavity therein, the cavity defining inner side walls and having a bottom surface;
    b) a first and second step located in the cavity, the first and second step located on opposing side walls, the first and second steps being at differing heights above the bottom surface;
    c) a first crystal mounted to the first step and extending over the cavity toward the second step; and
    d) a second crystal mounted to the second step and extending over the first crystal toward the first step.

13. The crystal package according to claim 12, wherein the first crystal resonates at a first frequency and the second crystal resonates at a second frequency.

14. The crystal package according to claim 13, wherein the first crystal consumes less power during operation than the second crystal.

15. The crystal package according to claim 12, wherein at least one contact pad is located on each step, each crystal having an electrode electrically connected to the contact pad.

16. The crystal package according to claim 15, wherein a metal bump connects the electrode to the contact pad.

17. The crystal package according to claim 15, wherein a conductive adhesive connects the electrode to the contact pad.

18. The crystal package according to claim 15, wherein a conductive via extends through the substrate between the contact pad and the bottom surface.

19. The crystal package according to claim 18, wherein a termination pad is located on the bottom surface and is electrically connected to the via.

20. The crystal package according to claim 12, wherein a cover seals the cavity.

21. The crystal package according to claim 12 wherein an electronic circuit is mounted in the cavity and electrically connected to the first and second crystals.

22. The crystal package according to claim 12, wherein the substrate has a second cavity in the bottom surface, an electronic circuit mounted in the second cavity and electrically connected to the first and second crystals.

* * * * *